(12) United States Patent
Hunton et al.

(10) Patent No.: US 7,002,407 B2
(45) Date of Patent: Feb. 21, 2006

(54) DELAY MISMATCHED FEED FORWARD AMPLIFIER SYSTEM USING PENALTIES AND FLOORS FOR CONTROL

(75) Inventors: Matthew J. Hunton, Liberty Lake, WA (US); Richard Neil Braithwaite, Orange, CA (US)

(73) Assignee: Powerwave Technologies, Inc., Santa Clara, CA (US)

( * ) Notice: Subject to any disclaimer, the term of this patent is extended or adjusted under 35 U.S.C. 154(b) by 44 days.

(21) Appl. No.: 10/733,498

(22) Filed: Dec. 11, 2003

(65) Prior Publication Data

US 2004/0124920 A1    Jul. 1, 2004

Related U.S. Application Data

(60) Provisional application No. 60/501,911, filed on Sep. 10, 2003, provisional application No. 60/434,825, filed on Dec. 18, 2002.

(51) Int. Cl.
*H03F 3/66* (2006.01)
*H03F 1/26* (2006.01)

(52) U.S. Cl. ........................................ 330/52; 330/151
(58) Field of Classification Search .................. 330/52, 330/149, 151
See application file for complete search history.

(56) References Cited

U.S. PATENT DOCUMENTS

| | | | |
|---|---|---|---|
| 4,580,105 A | 4/1986 | Myer | 330/149 |
| 5,023,565 A * | 6/1991 | Lieu | 330/151 |
| 5,130,663 A | 7/1992 | Tattersall, Jr. | 330/52 |
| 5,444,418 A | 8/1995 | Mitzlaff | 330/52 |
| 5,485,120 A | 1/1996 | Anvari | 330/151 |
| 5,570,063 A | 10/1996 | Eisenberg | 330/149 |
| 5,796,304 A | 8/1998 | Gentzler | 330/52 |
| 5,955,921 A | 9/1999 | Ide et al. | 330/254 |
| 6,028,477 A | 2/2000 | Gentzler | 330/149 |
| 6,169,450 B1 | 1/2001 | Gentzler | 330/52 |
| 6,259,319 B1 | 7/2001 | Ghanadan et al. | 330/149 |
| 6,340,914 B1 | 1/2002 | Gavrilovic | 330/52 |
| 6,441,686 B1 | 8/2002 | Nakamura | 330/85 |
| 6,452,446 B1 | 9/2002 | Eisenberg et al. | 330/52 |

(Continued)

OTHER PUBLICATIONS

Feedforward—An Alternative Approach to Amplifier Linearization, T.J. Bennett, R.F. Clements, *The Radio and Electronic Engineer*, vol. 44, No. 5, May 1974.

*Primary Examiner*—Steven J. Mottola
(74) *Attorney, Agent, or Firm*—Myers, Dawes Andras & Sherman LLP

(57) ABSTRACT

A delay mismatched feed forward amplifier system employing a control system and method using floors and penalties is disclosed. The disclosed control system and method allows the second loop phase adjuster setting to be offset in a repeatable and controlled manner. Applying floors and penalties to offset the steady-state phase adjuster setting modifies the conventional pilot cancellation approach. In the conventional case, pilot cancellation has a distinct minimum that corresponds to the desired adjustment setting. In the disclosed approach, the measured pilot cancellation is clipped to a lower bound or floor to produce a set of equal valued minimum control results. The floor is selected to place a desired phase offset to the phase adjuster at the edge of minimum floor. To ensure that the correct phase adjuster offset is selected from the set of equal valued minimum control results, a control direction based penalty is added. By including both the floor and penalty, the phase adjuster steady state offset will be controlled to the edge of the minimum floor.

4 Claims, 9 Drawing Sheets

U.S. PATENT DOCUMENTS

| | | | |
|---|---|---|---|
| 6,552,608 B1 | 4/2003 | Matsuda et al. | 330/52 |
| 6,553,211 B1 | 4/2003 | Zhou | 455/126 |
| 6,563,385 B1 | 5/2003 | Wojslaw | 330/296 |
| 6,573,793 B1 | 6/2003 | Gutierrez | 330/151 |
| 6,587,514 B1 | 7/2003 | Wright et al. | 375/296 |
| 6,593,811 B1 | 7/2003 | Schemmann et al. | 330/110 |
| 6,608,523 B1 | 8/2003 | Ly | 330/52 |
| 2001/0022532 A1 | 9/2001 | Dolman | 330/149 |
| 2002/0049513 A1 | 4/2002 | Nussbaum et al. | 700/186 |
| 2003/0042979 A1 | 3/2003 | Gurvich et al. | 330/151 |
| 2003/0052734 A1 | 3/2003 | Ishigami et al. | 330/151 |
| 2003/0107436 A1 | 6/2003 | Kenington | 330/149 |

* cited by examiner

DELAY MISMATCHED FEED FORWARD AMPLIFIER SYSTEM USING PENALTIES AND FLOORS FOR CONTROL

RELATED APPLICATION INFORMATION

The present application claims the benefit of provisional application Ser. No. 60/501,911 filed Sep. 10, 2003, and provisional application Ser. No. 60/434,825 filed Dec. 18, 2002, the disclosures of which are incorporated herein by reference in their entirety.

BACKGROUND OF THE INVENTION

1. Field of the Invention

The present invention relates to RF power amplifiers and amplification methods. More particularly, the present invention relates to feed forward amplifiers and methods for controlling feed forward amplifiers.

2. Description of the Prior Art and Related Background Information

RF amplifiers are devices that attempt to replicate a RF signal present at its input, producing an output signal with a much higher power level. The increase in power from the input to output is referred to as the 'gain' of the amplifier. When the gain is constant across the dynamic range of the input signal, the amplifier is said to be 'linear'. Amplifiers have limited capacity in terms of power delivered because of gain and phase variances, particularly saturation at high power, which makes all practical amplifiers nonlinear when the input power level varies. The ratio of the distortion power generated relative to the signal power delivered is a measure of the non-linearity of the amplifier.

In RF communication systems, the maximum allowable non-linearity of the amplifier is specified by government agencies such as the FCC or the ITU. Because amplifiers are inherently nonlinear when operating near saturation, the linearity requirements often become the limitation on rated power delivering capability. In general, when operating near saturation, the linearity of the amplifier degrades rapidly because the incremental signal power delivered by an amplifier is proportionally less than the incremental distortion power generated.

Various compensation approaches are conventionally applied to reduce the distortion at the output of the system, which in turn increases the rated power delivering capability. The preferred approach is feed forward compensation. In feed forward RF power amplifiers an error amplifier is employed to amplify main amplifier distortion components which are then combined out of phase with the main amplifier output to cancel the main amplifier distortion component. In general, feed forward compensation provides the power capability of the main amplifier and the linearity of the error amplifier.

The performance of a feed forward amplifier may typically be analyzed based on two cancellation loops. Loop1, called the carrier cancellation loop, includes the RF input and the main amplifier. In addition to the main amplifier signal output the first loop provides a distortion signal obtained by sampling the main amplifier output and combining it with an out of phase sample of the RF input signal. Conventionally, the gain and phase of the signal in loop1 are controlled to ideally provide a distortion signal with the input RF carrier component completely cancelled and only the distortion component remaining. Loop 2 is typically referred to as the error cancellation loop or auxiliary path loop. In loop 2 the distortion component provided from loop 1 is amplified by the error amplifier and injected back into the main path at an error coupler to cancel the distortion component in the main path and ideally provide a distortion free signal at the output.

In many cases, a pilot signal is injected at an offset frequency from the signal bandwidth inside the main amplifier signal path. This pilot acts as a known level of distortion at a known frequency. Isolation, detection, and cancellation of this pilot signal makes loop 2 gain adjuster and phase adjuster control easier. Traditional feed forward controllers minimize injected pilot power measured at a loop 2 test coupler configured after the error coupler. Pilot minimization is also referred to as pilot cancellation.

A problem with the traditional feed forward approach is the component cost and signal loss in the second loop delay. This delay may take the form of a delay cable or a delay filter. The longer the delay, the higher the delay cost and signal loss. The delay loss reduces the output power capability of the feed forward amplifier system by attenuating the main amplifier output. To compensate for this loss, a larger more costly main amplifier must be used. To reduce signal losses and component cost, the delay can be reduced or removed. Reducing or removing second loop delay introduces delay mismatch with the error path, which includes the error amplifier. This delay mismatch narrows the bandwidth of second loop cancellation, producing full cancellation at only one frequency. This cancellation bandwidth narrowing is caused by the phase shift with frequency error introduced by the delay mismatch. When controlling the second loop by reducing pilot power, as is done in traditional feed forward systems, the center frequency of second loop cancellation will be placed on top of the pilot frequency. Since the pilot is offset in frequency from the signal bandwidth, second loop cancellation will be lower in value and asymmetric to the signal bandwidth. Generally speaking, the distortion characteristics of the main amplifier will produce symmetrical spectral distortion characteristics about the input signal bandwidth, with the largest distortion nearest the signal in frequency. To meet output signal spectrum requirements, the bandwidth of second loop cancellation center frequency should be placed at the center frequency of the input signal.

Therefore, a need presently exists for an improved delay mismatched feed forward amplifier system which can address this problem of frequency dependent second loop cancellation and optimize system performance.

SUMMARY OF THE INVENTION

In a first aspect the present invention provides a feed forward amplifier comprising an input for receiving an RF signal, a main amplifier receiving and amplifying the RF signal, and a pilot signal source coupled between the RF input and the main amplifier. The feed forward amplifier further comprises a main amplifier output sampling coupler, a first delay coupled to the input and providing a delayed RF signal, and a carrier cancellation combiner coupling the delayed RF signal to the sampled output from the main amplifier. An error amplifier receives and amplifies the output of the carrier cancellation combiner and an error coupler combines the output from the error amplifier and the delayed main amplifier output from the second delay so as to cancel distortion introduced by the main amplifier. A phase adjuster is coupled between the carrier cancellation combiner and the error amplifier. An output is coupled to the error coupler output and provides an amplified RF signal. The feed forward amplifier further comprises a pilot signal detector coupled to the output and an adaptive controller, coupled to the pilot signal detector, for controlling the phase adjuster setting to provide a phase adjustment which is offset from a phase adjustment which minimizes the detected pilot signal, which offset is adjustable by changing the floor of a phase adjustment cost function.

In a preferred embodiment the feed forward amplifier pilot signal detector may comprise a pilot signal test coupler and a pilot signal receiver. The feed forward amplifier may also further comprise a second delay coupled between the main output sampling coupler and the error coupler, wherein the second delay is mismatched with the delay of the signal path through the error amplifier. The feed forward amplifier may also further comprise a gain adjuster coupled between the carrier cancellation combiner and the error amplifier and the controller controls the gain adjuster to provide a gain adjustment which minimizes the detected pilot signal. The adaptive controller preferably comprises a processor implementing a cost minimization search algorithm. The cost minimization search algorithm preferably includes a penalty based on the direction of phase adjustment. The feed forward amplifier may also further comprise a pilot reference coupler for sampling the pilot signal injected by the pilot signal source and wherein the adaptive controller is coupled to the pilot reference coupler and derives a pilot value from the detected pilot signal and pilot reference signal. The feed forward amplifier may also further comprise a loop back test switch coupled between the pilot reference coupler and the pilot receiver. The pilot frequency is preferably offset from the RF carrier frequency and the phase adjustment offset corresponds to a shift of center frequency of pilot cancellation to the RF carrier frequency.

According to another aspect the present invention provides a delay mismatched feed forward amplifier comprising an input for receiving an RF input signal. A first control loop is coupled to the input and comprises a main amplifier, a main amplifier sampling coupler, a delay element, and a cancellation combiner. A second control loop is coupled to the first control loop and comprises a first signal path, a second signal path comprising an error amplifier, and an error coupler coupling the first and second signal paths, the first and second paths having a delay mismatch. An output is coupled to the error coupler. A pilot signal source is coupled to the first control loop, and the feed forward amplifier includes means for detecting the pilot signal at the output. The feed forward amplifier further comprises means, coupled to the means for detecting, for controlling the second control loop to stabilize second control loop cancellation at a center frequency offset from the pilot signal frequency and adjacent the center of the RF signal bandwidth.

In a preferred embodiment of the delay mismatched feed forward amplifier the means for controlling comprises a phase adjuster in the second control loop and a processor implementing a loop control algorithm and providing variable adjuster settings to the phase adjuster. The means for detecting preferably comprises a second loop test coupler coupled to the output and providing an input to a pilot receiver. In a preferred embodiment, the processor and algorithm calculate a cost function associated with the adjuster settings which is derived from the detected pilot signal and a preset floor value of the cost function. The processor and algorithm vary the adjuster settings employing the cost function to move the calculated cost function toward the preset floor value. The processor and algorithm further add a penalty to the cost function if the cost function is at the floor value and the adjuster setting is moving in an undesired direction. The undesired direction may correspond to increasing phase adjuster settings or to decreasing phase adjuster settings, depending on the specific implementation.

According to another aspect the present invention provides a method for amplifying an RF input signal employing feed forward compensation. The method comprises receiving an RF input signal and providing the signal on a main signal path, injecting a pilot signal into the main signal path, sampling the RF input signal and providing the sampled RF input signal on a second signal path, and amplifying the signal on the main signal path employing a main amplifier. The method further comprises sampling the main amplifier output, delaying the sampled RF input signal on the second signal path, coupling the delayed RF input signal to the sampled output from the main amplifier so as to cancel at least a portion of a carrier component of the sampled output from the main amplifier and provide a carrier canceled signal having a distortion component, amplifying the carrier canceled signal employing an error amplifier to provide an error signal, and combining the error signal and the output of the main amplifier so as to cancel distortion introduced by the main amplifier and providing an amplified RF output. The method further comprises detecting the pilot signal in the amplified RF output, adjusting the phase of the signal input to the error amplifier by a variable phase setting and controlling the phase adjusting to a steady state setting offset from a setting which minimizes the detected pilot signal.

In a preferred embodiment of the method for amplifying an RF input signal employing feed forward compensation the controlling the phase adjusting comprises minimizing a phase control cost function having a floor and a penalty associated with the direction of the adjusting. The penalty may be associated with increasing or decreasing the phase of the signal, depending on the implementation. Also, the frequency of the pilot signal may be set below or above the center frequency of the RF input signal, depending on the implementation. The floor of the cost function defines a plurality of phase settings having equal cost and the steady state setting preferably comprises one of said plurality of phase settings having equal cost. For example, the steady state setting may comprise the lowest phase setting having equal cost. Alternatively, the steady state setting may comprise the highest phase setting having equal cost. The phase control cost function may be viewed as having a lower boundary defined by the floor, the lower boundary having first and second edges. The steady state setting may correspond to one of the first and second edges of the lower boundary of the cost function.

According to another aspect the present invention provides an adaptive controller for controlling a loop of an amplifier system. The adaptive controller comprises a receiver for receiving a pilot signal, and a processor coupled to the receiver and programmed with a loop control algorithm to provide as an output phase adjuster settings based on the received pilot signal. The loop control algorithm comprises a cost function having a floor value and a penalty associated with the direction of adjustment of the settings.

According to another aspect the present invention provides a method for controlling an amplifier system having a control loop comprising a control loop input, a first signal path, a second signal path, and a control loop output, at least one of the first and second signal paths including an amplifier. The method comprises detecting a pilot signal at the control loop output and comparing the detected pilot signal to a floor value. If the pilot signal is greater than the floor value a loop control cost function is set equal to the pilot signal. If the pilot signal is less than the floor value, the loop control cost function is set equal to the floor value. The method further comprises determining the adjustment direction of the loop control, and if the loop control is adjusting in an undesired direction adding a penalty to the floor value to derive a new cost function. The method further comprises adjusting the phase of the second signal path so as to minimize the value of the cost function.

According to another aspect the present invention provides a method of controlling a control loop of an amplifier system, the control loop having a first signal path and a second signal path, an input and an output, the first and second signal paths having a delay mismatch. The method comprises detecting a pilot signal at the output and adjusting the phase of at least one of the first and second signal paths. The method further comprises controlling the adjusting so that the detected pilot signal is at a level offset from a minimum value.

According to another aspect the present invention provides a method of controlling distortion cancellation of an RF signal in a control loop of an amplifier system, the control loop having a first signal path and a second signal path, an input and an output, the first and second signal paths having a delay mismatch. The method comprises injecting a pilot tone into the RF signal, the pilot tone having a frequency offset from the center frequency of the RF signal bandwidth, and detecting the pilot signal at the output. The method further comprises controlling the phase of at least one of the first and second signal paths of the second control loop to stabilize second control loop distortion cancellation at a frequency offset from the pilot signal frequency and generally symmetrical about the center of the RF signal bandwidth.

Further features and advantages are described in the following detailed description of the invention.

DETAILED DESCRIPTION OF THE INVENTION

Figure 1:
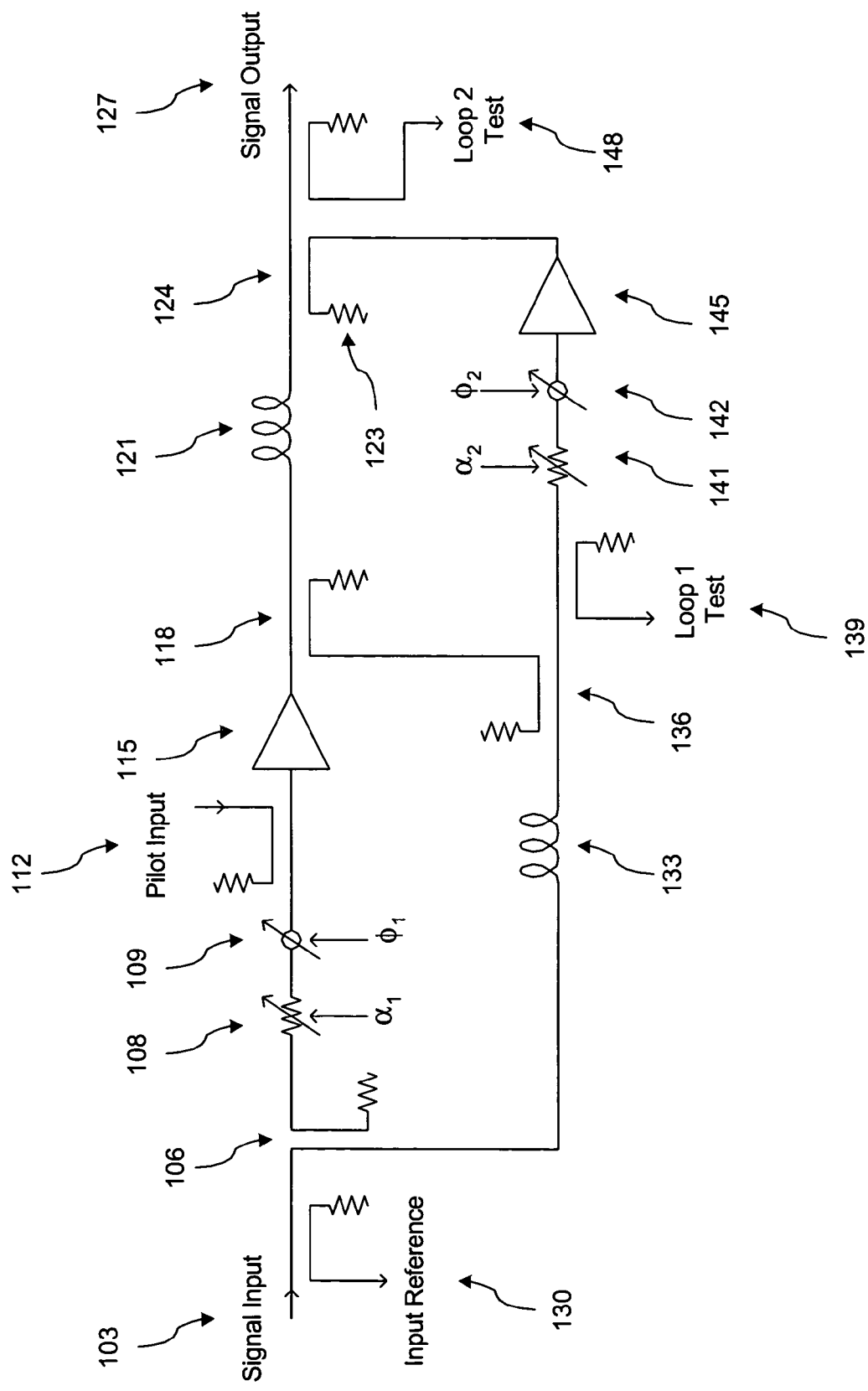
FIG. 1 is a block schematic drawing of a feed forward compensated power amplifier in accordance with the present invention.
Figure 2:
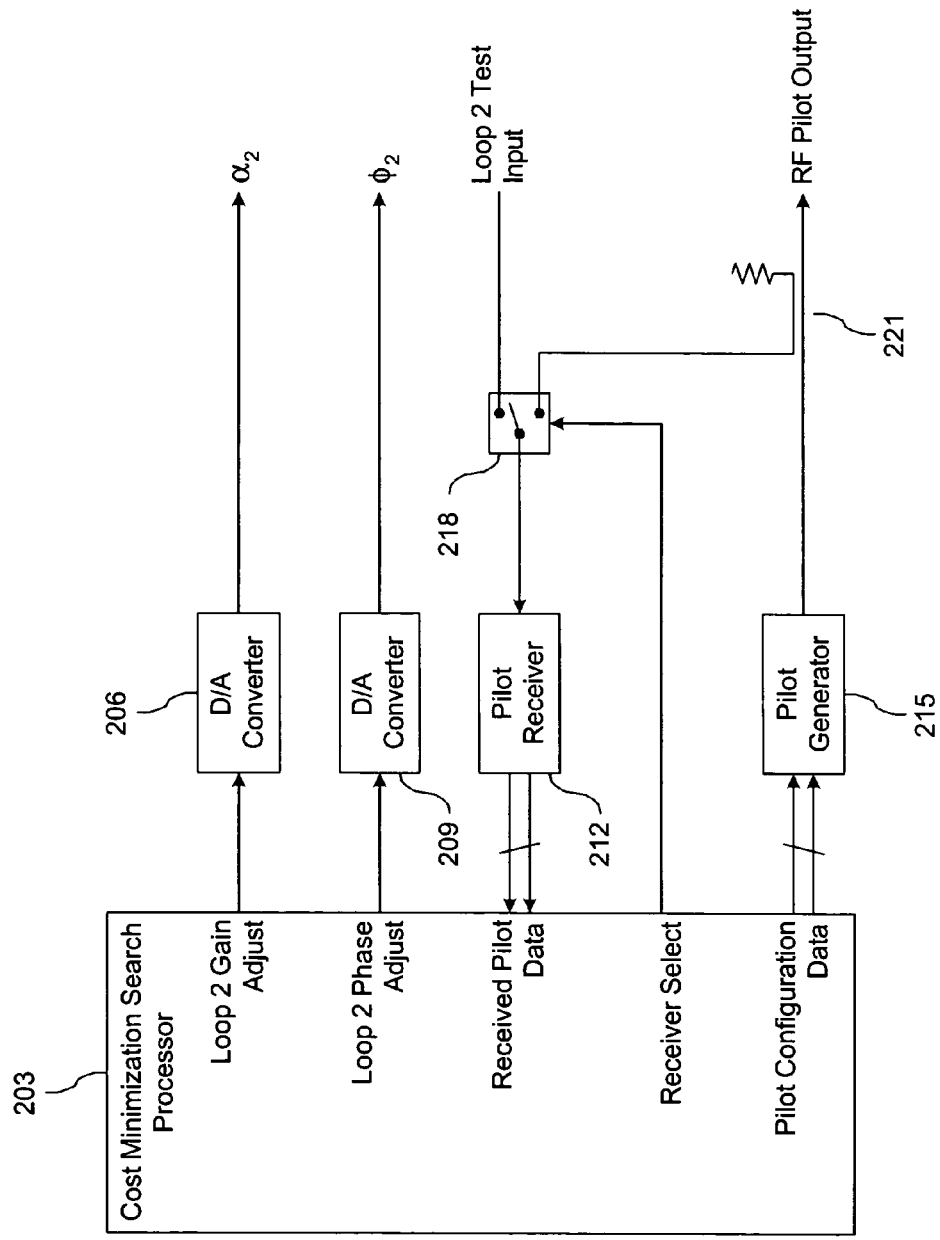
FIG. 2 is a block schematic drawing of a feed forward detection and control system in accordance with the present invention.

A block diagram of the feed forward compensated power amplifier (PA) system in accordance with a preferred embodiment of the present invention is shown in FIGS. 1 and 2. FIG. 1 illustrates the basic feed forward amplifier and FIG. 2 illustrates the controller.

As shown in FIG. 1, the feed forward amplifier has a conventional architecture employing two control loops. Loop 1 comprises signal input 103, sampling coupler 106, gain adjuster 108, phase adjuster 109, pilot signal input coupler 112, main amplifier 115, main sampling coupler 118, input reference coupler 130, delay 133, cancellation combiner 136, and loop 1 test coupler 139. Loop 2 comprises main sampling coupler 118, main path delay 121, error coupler 124, carrier cancellation combiner 136, loop 2 gain adjuster 141, loop 2 phase adjuster 142, error amplifier 145, loop 2 test coupler 148 and output 127. As shown in FIG. 2, the controller may comprise a processor 203 which implements a cost minimization search algorithm described in detail below. Digital to analog converters 206, 209 convert the digital gain adjust and phase adjust control signals to analog signals $\alpha_2$, $\phi_2$ which are provided to the gain and phase adjusters 141 and 142 (shown in FIG. 1). A pilot generator 215 generates a pilot signal which is provided to pilot signal input coupler 112 (shown in FIG. 1). A pilot signal receiver 212 detects any uncancelled pilot signal from the loop 2 test coupler 148 (shown in FIG. 1) and provides the detected pilot signal in digital form to processor 203. A pilot reference coupler 221 and loop back switch 218 are also provided, the operation of which will be explained below.

First the general principles of operation will be described. Controlling loop 1 involves the adjustment of the settings of gain adjuster 108 and phase adjuster 109, denoted by $\alpha_1$ and $\phi_1$, to reduce the first loop gain measured from the input reference coupler 130 to the loop 1 test coupler 139. The gain and phase adjuster values are referred to herein as "adjuster settings". Control methods for the first loop are well known to those skilled in the art and are not described in detail herein. Alternatively, the approach of provisional application Ser. No. 60/434,825 may be employed. For controlling loop 2, the desired settings $\alpha_2$, $\phi_2$ of the gain and phase adjusters, 141 and 142, respectively, minimize the distortion detected at loop 2 test coupler 148. A pilot signal source 112 injects a pilot signal at an offset frequency from the signal bandwidth inside the main amplifier 115 path (after 106 but before 118). This pilot acts as a known level of distortion at a known frequency. Isolation, detection, and cancellation of this pilot signal makes loop 2 gain and phase adjuster control easier.

The present invention provides a new adaptive control system and method for feed forward systems (FIG. 1) where the second loop delay is not matched. In traditional delay matched feed forward systems both the second loop gain adjuster 141 and phase adjuster 142 would be controlled to minimize the partial derivative of injected pilot power with respect to adjustment when measured at the system output 148. In second loop delay mismatched systems, the traditional method would produce second loop cancellation at the pilot frequency, but less cancellation in the input signal bandwidth. This difference in cancellation with frequency is due to the phase shift with frequency errors introduced by the delay mismatch. The present invention modifies this traditional approach to account for delay mismatch. In the present invention, the gain adjuster 141 may be controlled following the standard approach of minimizing the partial derivative of injected pilot power with respect to gain adjustment. However, the phase adjuster 142 is offset intentionally causing an incomplete cancellation of the pilot in the second loop. With the second loop delay mismatched, this intentional misalignment of the second loop phase adjuster controls the frequency of full second loop cancellation. By adjusting the cancellation level of the pilot, the center frequency of second loop cancellation can be adjusted to the center frequency of the amplified signal. The feed forward amplifier will then produce symmetrical spectral performance with frequency about the input signal bandwidth. When using the present invention, the injected pilot level should be set to meet feed forward spurious requirements with less than full cancellation.

The present invention further provides a system and method of specifying and controlling the steady-state offset of the second loop phase adjuster 142. By altering the "cost function" of the second loop phase adjustment, the desired phase adjuster offset becomes the steady-state adjustment. Floors and penalties are incorporated into the second loop phase minimization approach to allow for precise alignment of the phase adjuster 142 setting offset. The phase adjuster setting offset can be controlled to compensate for delay mismatch in the second feed forward loop.

Next, referring to FIGS. 1–9 a specific embodiment of the present invention will be described. The present invention provides a system and method for controlling the second loop phase adjuster 142 to a phase adjuster setting offset from the traditional second loop cancellation phase adjuster setting. The present invention may be implemented as a modification to existing feed forward loop control systems and methods, several of which exist. The present invention can be applied to all of these presently available systems and methods. In the interest of brevity, the present invention will be described by application to one commonly used system and method. Those skilled in the art will easily understand the application of the present invention to other commonly used pilot based second loop cancellation systems and methods.

Loop control is an iterative process where a two-dimensional space of adjuster settings, gain and phase, is searched. The second loop adjuster settings that provide minimum control cost is the desired steady-state value. In traditional feed forward systems, minimum control cost would coincide with minimum received pilot at the system output 148. In the present invention, the control cost function is modified to achieve an alternate result. With this new method of determining control costs, all standard pilot cancellation control processes can be used. A commonly used cost minimization search method is based on coordinate descent. A coordinate search, applied to the task of second loop pilot cost minimization of a feed forward amplifier, makes adjustments along one of the coordinate directions at a time, alternating between the gain and phase. Also, the present invention can be equally applied to in phase (I) and quadrature (Q) adjusters and the controller can make the appropriate virtual gain and phase settings.

Control adjustment step size is another aspect of loop control. In general, large step sizes allow faster convergence, but have a greater possibility of instability and higher steady-state error. Small step sizes have better steady-state performance but have slow convergence. Effective control algorithms adjust step sizes dynamically to provide rapid convergence, stability, and small steady state control error. A commonly used step size selection approach adjusts step sizes as necessary depending on the rate of received pilot minimization.

Consider the feed forward amplifier block diagram shown in FIG. 1. The error path of the second loop includes a main amplifier sample coupler 118, input signal cancellation coupler 136, gain adjuster 141, phase adjuster 142, and error amplifier 145. The main amplifier output is delayed 121 and combined with the error path in the error combining coupler 124. The delay 121 is not matched with the error path delay and in some cases a delay element 121 may not even be employed with only an intrinsic delay present in the main path. This combination completes the second loop. Adjusting the gain adjuster 141 and phase adjuster 142 will produce various degrees of distortion cancellation.

A system for both controlling the second loop gain adjuster 141 and phase adjuster 142 while generating and receiving a pilot signal is shown in FIG. 2. The gain adjuster 141 and phase adjuster 142 control values or settings are calculated by the cost minimization processor 203 and set using digital to analog converters 206 and 209 respectively. The pilot generator 215 creates a pilot signal specifically designed for reception by the pilot receiver 212. Several methods exist for pilot generation and pilot reception. These methods are well known to those skilled in the art. The purpose of each of these methods is to create a pilot signal that can be easily isolated from the desired signal and distortion also found at the loop 2 test coupler 148 of FIG. 1. With the pilot isolated, the second loop can be adjusted for distortion cancellation by canceling the injected pilot. The present invention applies to all pilot generation and reception methods currently used in feed forward systems to aid in second loop cancellation.

FIG. 2 also shows a loop back switch 218 for pilot receiver calibration. This loop back switch is optional. If the loop back switch option is used, the received pilot level can be compared to the generated pilot level. Second loop pilot cancellation can then be calculated from these two measurements. By including the switch, pilot configuration data to the pilot generator 215 from the cost minimization processor 203 can dynamically control generated pilot level. With each change in pilot generation level, the control switch can select the pilot generator, measure the source-pilot level, return the switch to the loop 2 test coupler, and calculate received pilot cancellation for each subsequent measurement. The switch may also be used to occasionally measure the generated pilot level to remove pilot generation power drift with temperature or source voltage changes. With the pilot level control capability provided by the loop back switch, the pilot level can be lowered dynamically during loop control, to reduce pilot signal output 127 from the feed forward amplifier while maintaining adequate received pilot strength for loop control. Without the optional switch, the generated pilot level should initially be set to a low level to avoid spurious feed forward output, should be calibrated prior to operation, and should be held constant through operation.

The pilot generation feedback switch shown in FIG. 2 provides the simplest method for generated pilot loop back calibration. The pilot level, however, could be measured anywhere in the second loop prior to combining in the error coupler 124. For example, a coupler could be placed just after the main amplifier but before the error combining coupler 124, between the main sample coupler 118 and the loop 1 combining coupler 136, or the loop 1 test coupler 139 could be used. The approach shown in FIG. 2 has the advantage of not including any input signal 103 or distortion generated by the main amplifier 115. The disadvantage of the FIG. 2 approach is that it measures the pilot power coupled 112 into the first loop, prior to the main amplifier. The main amplifier gain may change with temperature and supply voltage. Since the second loop actually begins just after the main amplifier 115, gain drift in the main amplifier will appear to change the pilot cancellation level. If gain changes in the main amplifier 115 are significant in a particular system, the pilot inject coupler 112 can be moved to just prior to the first loop gain adjuster 108. When the first loop gain adjuster setting is set to achieve input signal cancellation, (in a manner known to those skilled in the art) gain drift in the main amplifier will be dynamically offset by the first loop gain adjuster 108.

Figure 8:
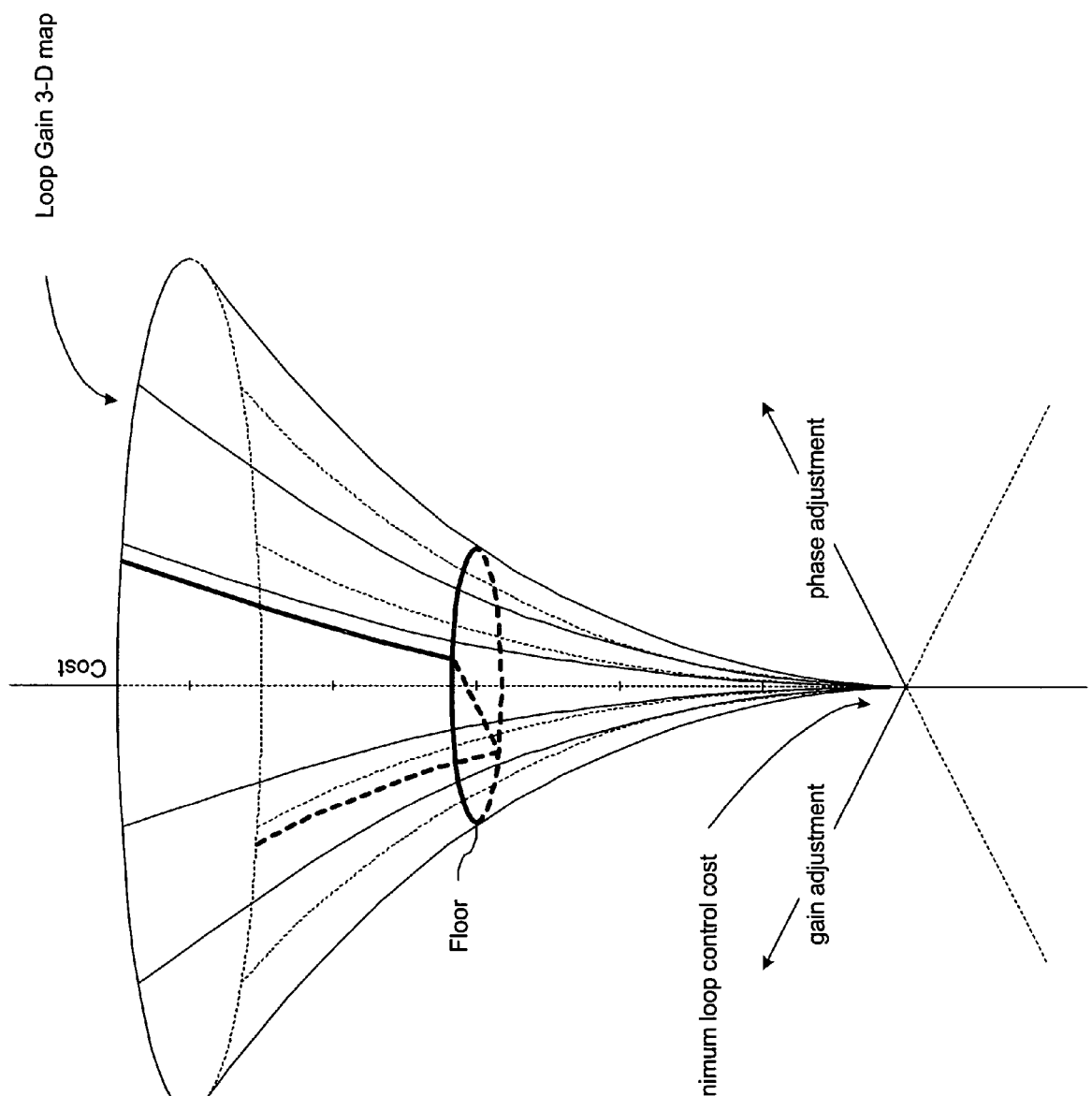
FIG. 8 is a three dimensional control cost diagram illustrating the control system and method of the present invention.

The pilot generation, reception and control method described provides a system and method to map second loop pilot cancellation. An ideal three-dimensional mapping of pilot cancellation as a function of second loop gain adjuster 141 and phase adjuster 142 control is shown in FIG. 8. This mapping can also be described as the cost function for loop control. Traditional feed forward systems would control the gain and phase adjuster settings to produce minimum cost. The present invention alters the pilot minimization based cost function by including floors and penalties. By including floors and penalties, control to steady-state phase adjuster offset will be achieved.

Figure 3:
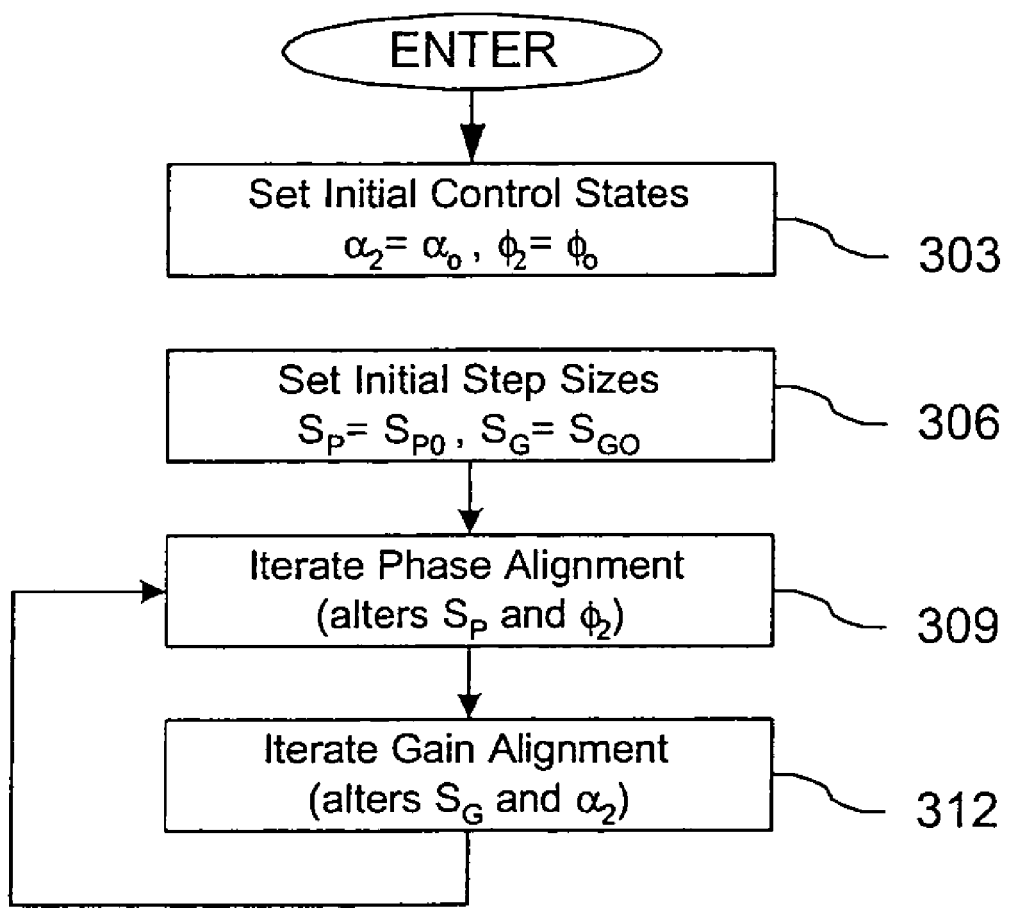
FIG. 3 is a block schematic drawing of a second loop control processing algorithm in accordance with the present invention.

FIG. 3 provides a block diagram for a coordinate based loop control algorithm. The algorithm begins by setting second loop gain adjuster 141 and phase adjuster 142 starting values 303. Next, initial gain adjuster and phase adjuster step sizes are selected 306. The algorithm then iterates between phase adjustments 309 and gain adjustments 312. A phase adjustment optimizing algorithm, shown in FIG. 4, exists within the iterate phase adjustment block 309. A gain adjustment optimizing algorithm, shown in FIG. 5, exists within the iterate gain adjustment block 312. Both the gain and phase adjustment algorithms include a step size control method. FIG. 3 does not include an exit. In practical systems, an exit may need to be added. An exit strategy would be application dependent, is not included in the scope of the present invention, and should be obvious to those skilled in the art.

Figure 4:
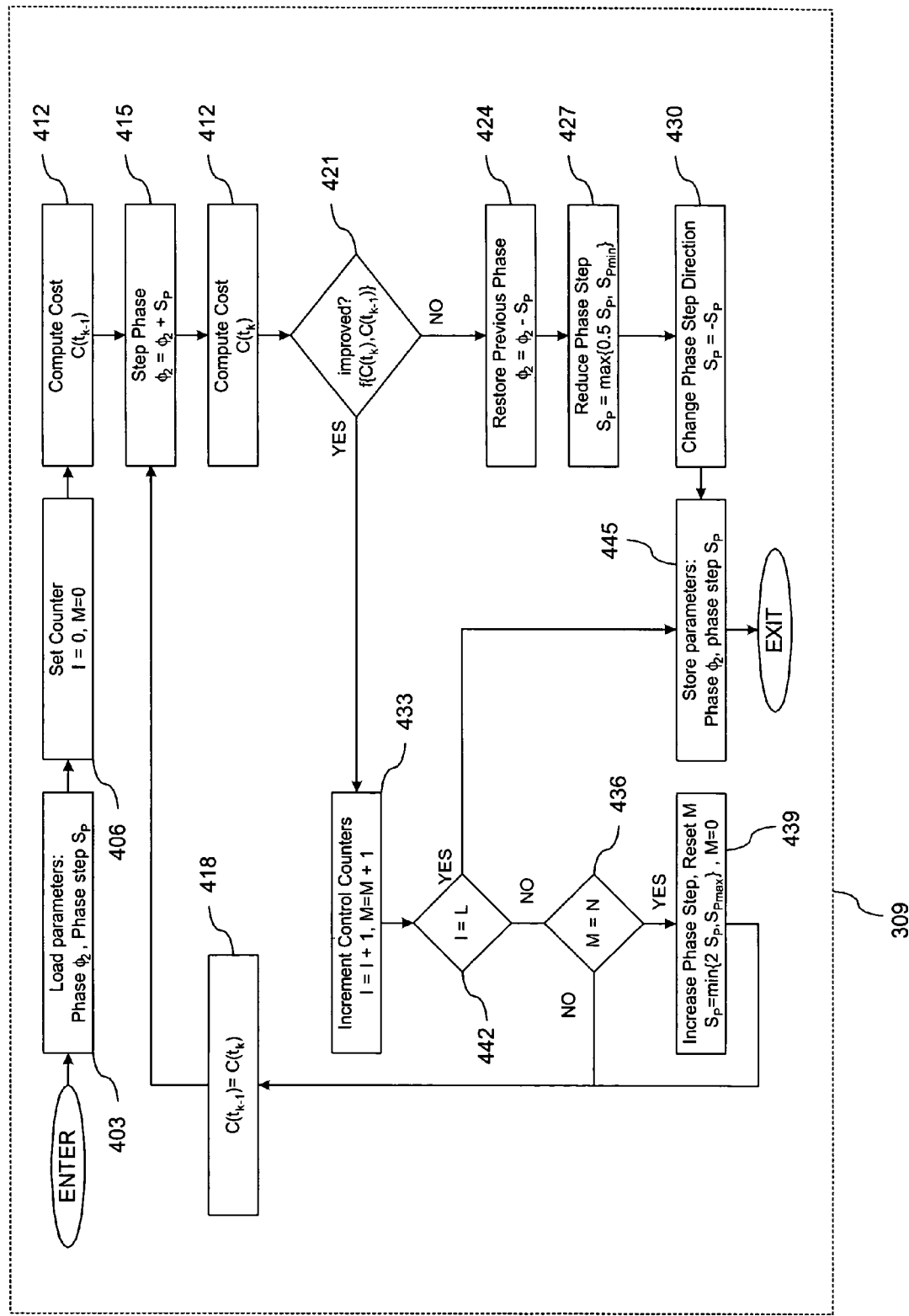
FIG. 4 is a block schematic drawing of a second loop phase control processing algorithm in accordance with the present invention.

FIG. 4 contains the phase adjuster control algorithm 309. The steps shown in this algorithm provide a step size controlled cost function minimization algorithm. Upon entering the algorithm, the current phase adjuster value and phase control step size are loaded from memory 403. Control counters are then set which monitor the total number of adjustments "I", and the number of consecutive adjustment improvements "M" 406. The second loop cost is then measured 412. (A block diagram of the cost function algorithm is found in FIG. 6.) A phase step is then taken 415 followed by a second control cost measurement. These two cost measurements are then used to determine if the loop control improved 421. If the control did improve, both the total "I" and the improve "M" counters are incremented 433. The total adjustment counter "I" is then compared to a maximum adjustment constant "L" 442. If maximum adjustment constant is reached, the phase adjuster value and control step size are stored 445 and the loop is exited for gain adjustments. If the maximum adjustment constant "L" was not reached, the improve counter "M" is then compared to a user defined control damping constant "N" 436. If the improve counter "M" is less than "N", the first cost measurement is set equal to the second cost measurement 418 and the control is looped back for additional phase steps 415. If the number of consecutive improvements equals "N" 436, then the phase step size is doubled but bounded to the maximum phase step ($S_{Pmax}$) and the improve counter "M" is reset to zero 439. Following the change in step size and improve counter reset 439, the first cost measurement is set equal to the second cost measurement 418 and the control is looped back for additional phase steps 415. If the evaluation of two measured costs 412 determines that the loop adjustment did not improve, the phase is restored to its previous value 424. After restoring the phase, the phase step size is halved but bounded to the minimum phase step ($S_{Pmin}$) 427, and the phase step direction is reversed 430. Finally the current phase adjuster control value and current step size are stored 445 and the loop is exited for gain adjustments.

In the above phase control algorithm the phase step size is doubled every time "N" consecutive loop control improvements are made. The damping constant "N" determines how fast the phase control accelerates towards the desired adjustment setting. If "N" were set equal to 1, phase adjuster control steps would double with each improvement. Such control would be rapid but may be unstable or cause large overshoot from the desired steady-state value. If "N" were set to a large number, step sizes would rarely increase causing slow convergence. Typically an "N" value in the 2 to 4 range is ideal.

In the above phase control algorithm, phase adjustments are stopped after "L" phase adjustments. This exit method is included to prevent the possibility of an infinite control loop. For example, "L" may be set to three to five times the damping constant "N."

In the above phase control algorithm, the phase step size is halved and direction reversed with each detrimental control adjustment. The algorithm assumes that the previous phase step overshot the desired control setting. By cutting the control step size in half with each detrimental adjustment, each subsequent overshoot will be smaller than the previous. The algorithm also shows moving on to gain adjustment immediately after one detrimental phase adjuster control step. As an alternative, one could change step direction after each detrimental gain adjuster step and then count some number direction changes before halving the phase step and moving on to gain adjustments. Such a method does help for the first phase step, if that step causes a detrimental adjustment. Generally, however, increasing the number of detrimental adjustments to more than 1 simply slows convergence. If such a counter is added, the number of detrimental adjustments should never be more than 2 before halving the phase step size and exiting for gain adjustments.

Figure 5:
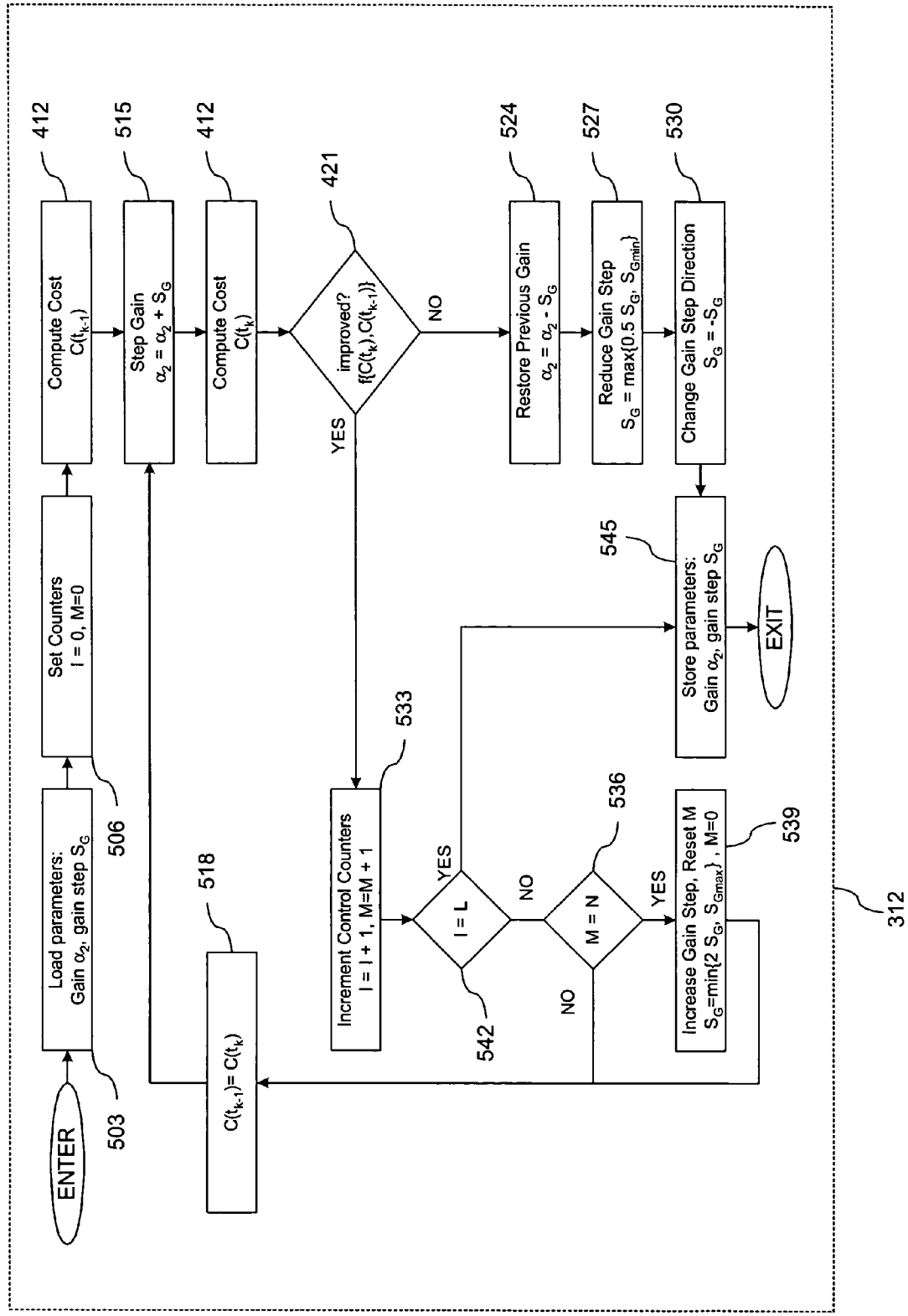
FIG. 5 is a block schematic drawing of a second loop gain control processing algorithm in accordance with the present invention.

FIG. 5 shows an identical process for gain control 312. The description of gain adjuster 141 control follows that of phase adjuster control exactly with gain adjuster values and gain steps substituted for phase adjuster 142 values and phase steps. The difference in gain and phase control is found in how loop control costs and loop improvements are determined.

Figure 6:
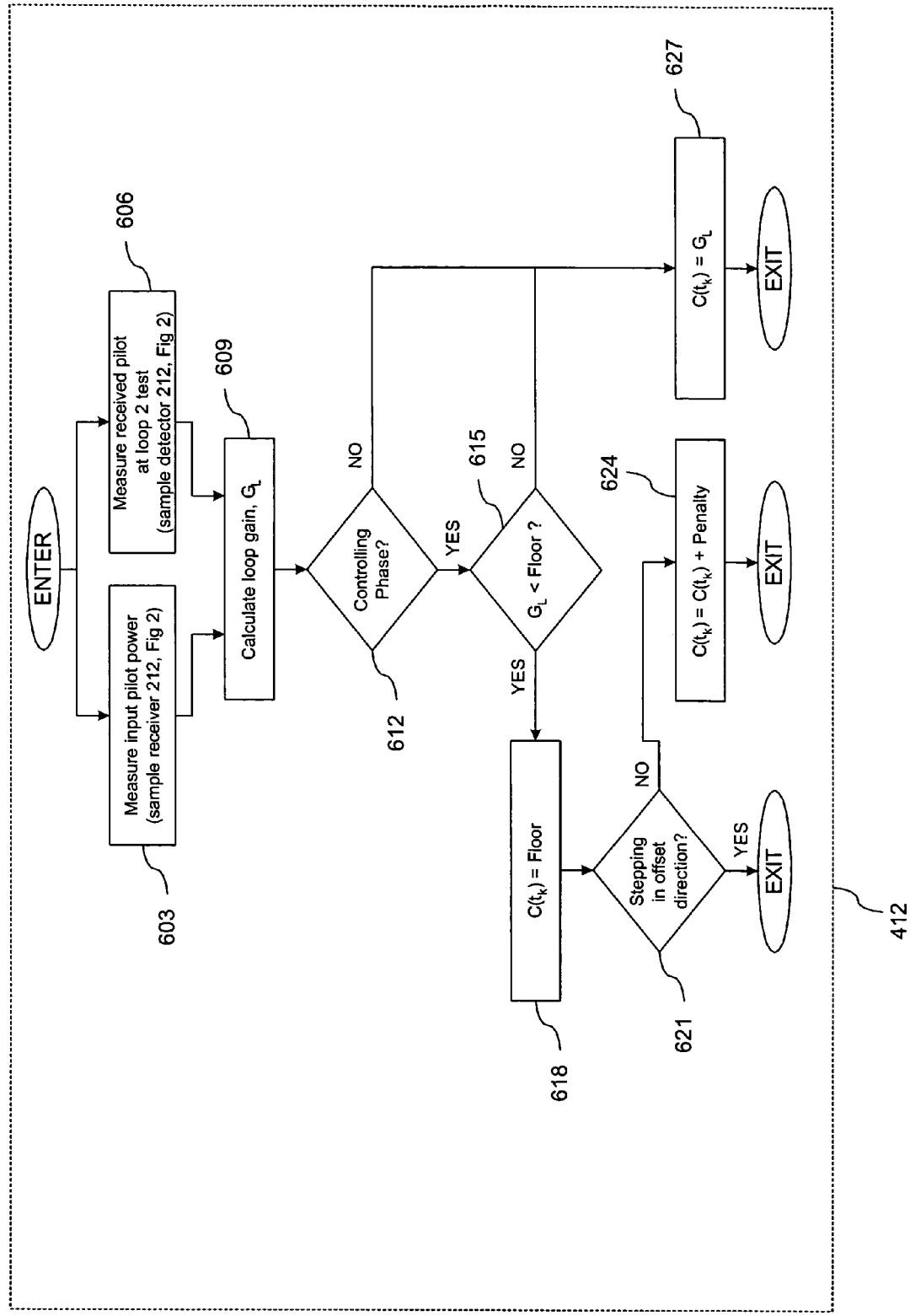
FIG. 6 is a block schematic drawing of a control cost processing algorithm in accordance with the present invention.

FIG. 6 provides the loop control cost calculator. After entering the cost calculator, received pilot power measurements are made from the feed forward amplifier 606. These pilot measurements may be referenced to the pilot signal without cancellation 603. This can be done using the optional loop back switch 218 shown in FIG. 2 to occasionally measure the injected pilot power level using pilot reference coupler 221. The pilot reference can also be measured once during feed forward initialization by receiving the pilot with the error amplifier 145 turned off. Pilot minimization (or loop gain) can then be calculated 609 from the received measurements 606 and the reference level 603. If the cost calculator is operated from the gain algorithm 312, the control costs are set equal to the pilot minimization 627 and the calculator is exited. If the cost calculator is operated form the phase algorithm 309, the pilot cancellation is compared 615 to a cost floor. If the pilot minimization is higher than the floor, the cost is set equal to the pilot minimization 627 and the cost calculator is exited. If the pilot minimization is lower than the floor, the cost is set equal to the floor 618. Next the desired direction of control offset is determined 621. (If for example, the phase adjustment is currently stepping in the reduced phase adjustment direction, and a reduced phase adjustment offset is desired, the determination at 621 is a yes.) If the phase adjustment is currently moving in the desired direction of control, the cost calculator is exited. If the control is moving in the opposite direction of desired offset, a penalty is added to the cost 624 and then the cost calculator is exited.

Figure 9:
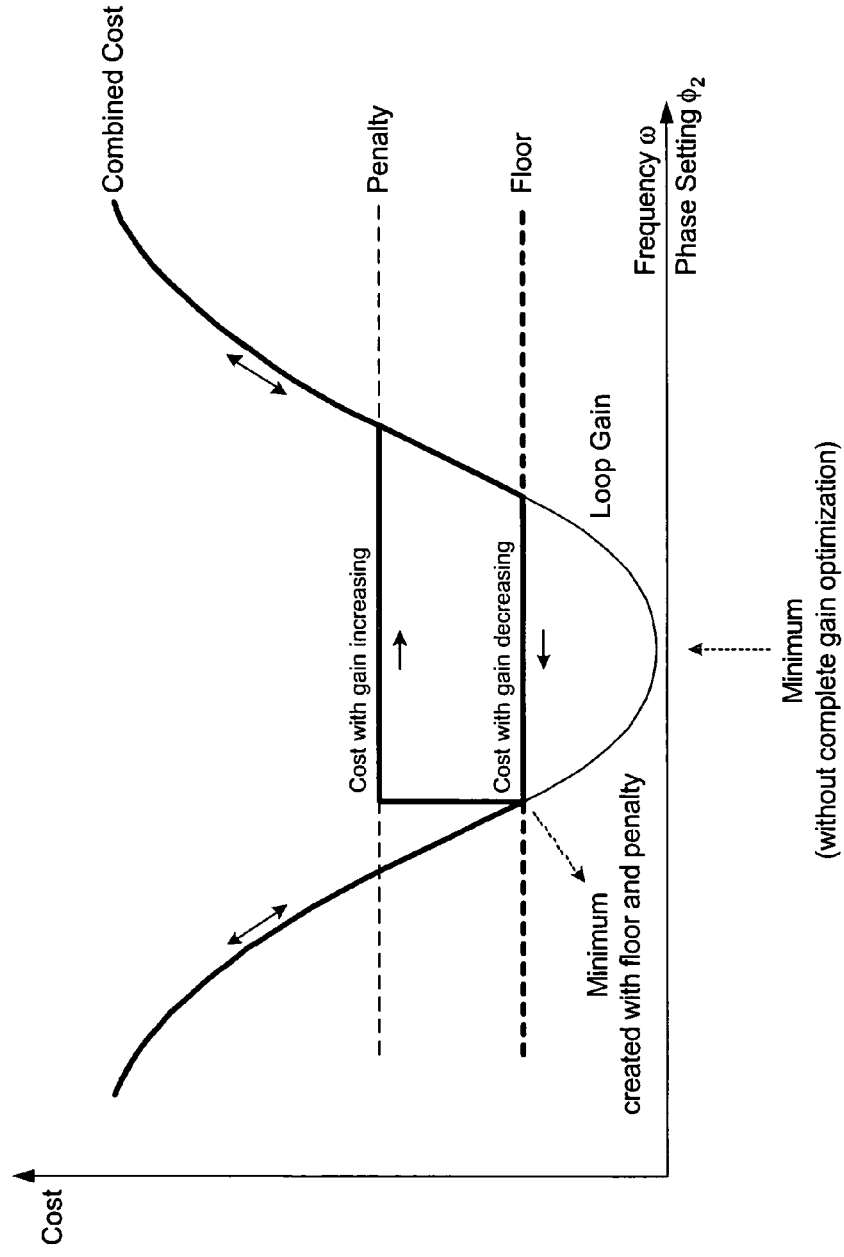
FIG. 9 is a two dimensional slice of the three dimensional control cost diagram of FIG. 8.

FIG. 8 and FIG. 9 show graphically how the cost calculator works. FIG. 8 shows a three-dimensional plot of an ideal second loop cost function. Both the gain adjuster and phase adjuster setting determine the pilot minimization or the loop gain, for example, measured from the pilot input 112 and loop 2 test 148. Both the gain adjuster 141 and phase adjuster 142 can be controlled to increase or decrease pilot minimization. When adjusting gain 141, the control cost is determined directly from the pilot minimization map. When controlling the phase adjuster 142, a floor is placed at a specific level of pilot minimization. FIG. 8 includes a cost trace without penalty where the phase adjuster 142 is varied and the gain adjuster 141 is held constant with a slight offset from best gain adjustment. Both of these traces are reproduced in FIG. 9. Also included in FIG. 9 is the cost effect of including a penalty for increasing phase. Such a penalty will favor phase adjuster offsets in the reduced direction. The penalty could have been applied to reducing phase. If the penalty were applied to reducing phase, the floor and penalty cost minimum would have been placed at the higher phase edge of the floor boundary.

The abscissa of FIG. 9 is marked in both phase setting $\phi_2$, and frequency $\omega$. With the delay of the second loop mismatched, a phase shift error with frequency is introduced into the second loop cancellation calculation. For a given delay error, an incremental offset in phase shift from maximum pilot frequency minimization, or minimum loop gain in the second loop (as measured, for example, from pilot source 112 to loop 2 test coupler 148), will correspond to an incremental shift in the frequency of maximum distortion cancellation in the second loop. FIG. 9 shows a case where the pilot frequency is placed below the center frequency of the input signal. If the penalty had been applied to reducing phase, the floor and penalty cost minimum would simply have been placed at the higher phase edge of the floor boundary and the pilot would be placed at a frequency above the signal bandwidth.

Figure 7:
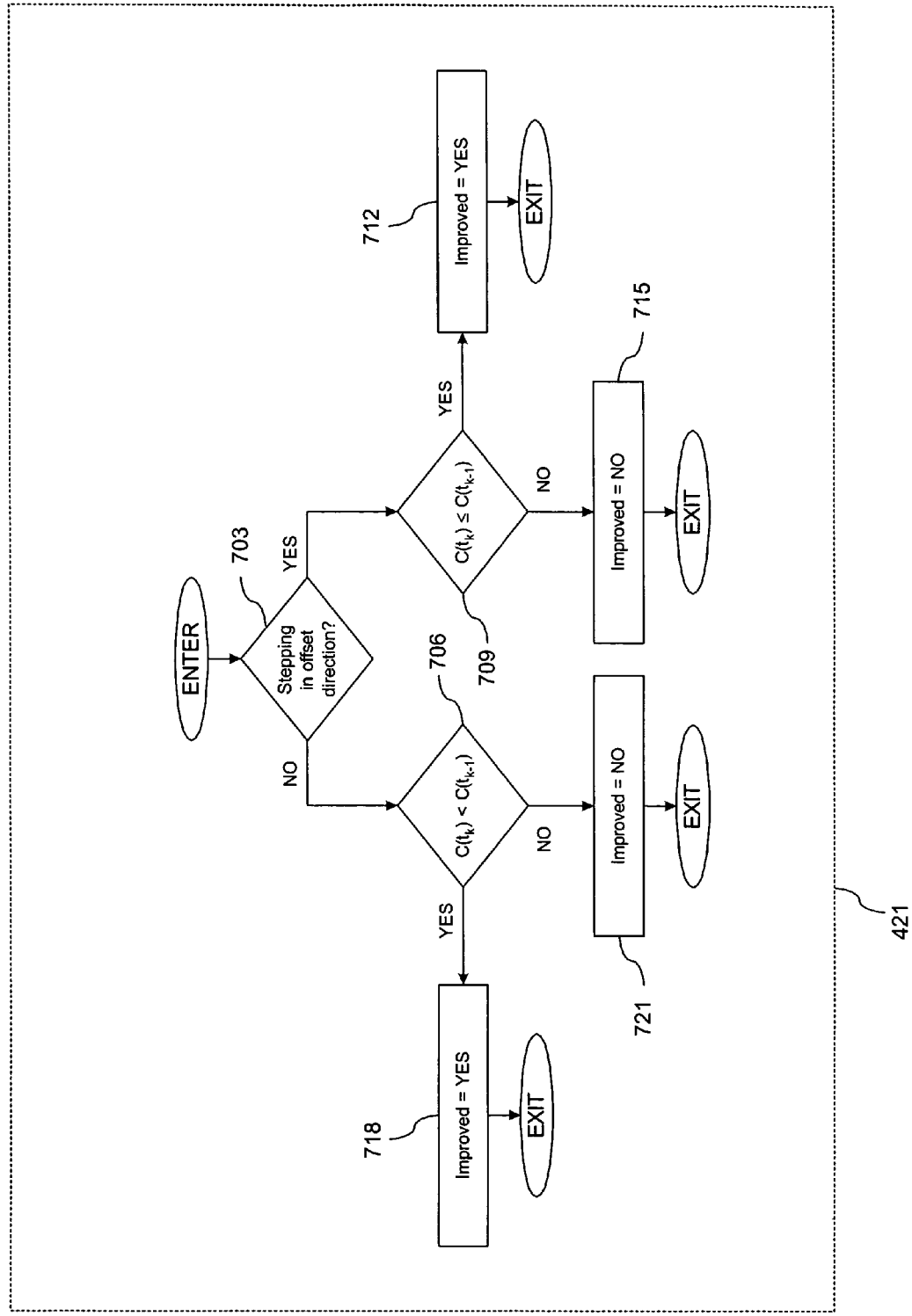
FIG. 7 is a block schematic drawing of a control improvement determination algorithm in accordance with the present invention.

Finally, FIG. 7 shows the control improvement calculator. The control improvement calculator primarily determines that loop control improves when the second measured cost is lower then the first measured cost. A problem however may arise if the first and second measured costs are equal. The control improvement calculator determines if a control improvement occurred, based on the control step direction and the direction of desired phase adjuster offset 703. If the phase adjustment is currently stepping in the direction of the desired offset, an equal second adjustment will be considered improved control 709. If the phase adjuster control is currently stepping in a direction opposite from the desired offset direction, an equal second adjustment will be considered detrimental control 706. By determining the equal cost cases in this way, an infinitely small penalty is placed on stepping in the opposite from desired direction. This alone will tend to push control offset in the desired direction. A larger fixed penalty should however still be added, as was done in FIG. 6, to avoid control confusion in the presence of noise. Since the pilot level will be set low to avoid spurious emissions from the feed forward output 127 received noise may be a problem. With the penalty added as described in FIG. 6, a control calculator that always assigns improved performance to consecutive equal costs cases will in most cases operate without problem. The control improvement calculator given in FIG. 7 however removes any control ambiguity for equal costs.

Generally speaking, the penalty value used in the described control algorithm can be set to any arbitrary large value. If the phase control sets the cost just at the floor boundary, but no penalty is added, a step of the phase adjuster setting away from the penalty direction should always produce a cost increase smaller than the cost increase caused by stepping in the penalty direction. Since step sizes can vary as described in FIG. 4 the goal should be to set the penalty cost higher than the cost produced by the maximum allowable phase step in the direction opposite of the penalty.

The floor value could be calculated based on desired results. For a given group delay match error in the second loop, a phase shift with frequency will result when comparing the second loop error amplifier 145 path with the second loop delay path 121. By removing or reducing the second loop delay 121, the delay of the error amplifier 145 path will be longer than that of the delay 121 path. If the pilot is placed below the desired signal bandwidth, such a delay mismatch will result in a phase adjuster setting in the reduced direction from traditional second loop pilot minimization to achieve second loop cancellation centered in the desired signal bandwidth. From the pilot frequency offset and the group delay match error, the desired phase adjuster offset can be calculated. From the phase adjuster setting offset, the degree of pilot minimization can be calculated from the pilot minimization function, given in FIG. 8 and FIG. 9, without floor and penalty added. The floor and penalty direction can then be set to achieve this calculated result.

Generally speaking, however, the calculated approach need not be followed. Instead the phase adjustment offset can be tuned by adjusting the floor and pilot level. During tuning, loop back calibration should be suspended. The penalty direction should set to increasing phase adjuster settings for longer error path delay as mentioned above. Initially the floor value would be set to the lowest possible level, and the injected pilot would be set to an easily detectable level. When the cost minimization processor 203 is turned on the second loop will be controlled to the traditional pilot minimization setting. The floor should then be increased until the phase adjuster setting offset just begins. This sets the floor near the minimum sensitivity of the pilot generator 215 and receiver 212 system shown in FIG. 2. The injected pilot level 112 can then be slowly decreased while monitoring feed forward linearity for symmetrical performance above and below the input signal bandwidth. (Reducing the pilot level while holding the floor constant, in effect, increases the floor value when the loop back option 218 is not present or is currently disabled.) The symmetry of the spectral performance should improve as the amount the phase adjustment setting is offset in the reduced direction is increased with the decreasing pilot level. At some point nonlinear spectrum distortion will shift from less spectral power below the carrier bandwidth, through symmetry, to less above the carrier bandwidth. In this manner, the phase adjuster setting offset can then be tuned to produce the desired power spectrum symmetry. Once the unit is tuned to the proper phase adjustment offset the loop back can be enabled to track drift in the pilot generator power. By following this tuning approach, or one similar, each manufactured unit can be easily set to the correct phase adjustment offset on a unit-by-unit basis.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. An adaptive controller for controlling a loop of an amplifier system, comprising:
    a receiver for receiving a pilot signal; and
    a processor coupled to said receiver and programmed with a loop control algorithm to provide as an output phase adjuster settings based on the received pilot signal, the loop control algorithm comprising a cost function having a floor value and a penalty associated with the direction of adjustment of the settings amongst settings with measured cost equal to or below the floor value.

2. A method for controlling an amplifier system having a control loop comprising a control loop input, a first signal path, a second signal path, and a control loop output, at least one of said first and second signal path including an amplifier, said method comprising:
    detecting a pilot signal at the control loop output;
    comparing the detected pilot signal to a floor value;
    if the pilot signal is greater than said floor value setting a loop control cost function equal to the pilot signal;
    if the pilot signal is less than said floor value, setting the loop control cost function equal to the floor value;
    determining the adjustment direction of the loop control;
    if the loop control is adjusting in an undesired direction adding a penalty to the floor value to derive a new cost function; and
    adjusting the phase of the second signal path so as to minimize the value of the cost function.

3. A method of controlling a control loop of an amplifier system, said control loop having a first signal path and a second signal path, an input and an output, said first and second signal paths having a substantial delay mismatch, said method comprising:
    detecting a pilot signal having a single pilot frequency at said output;
    adjusting the phase of at least one of said first and second delay mismatched signal paths; and
    controlling said adjusting so that said detected pilot signal is at a stable steady state level offset from a minimum value.

4. A method of controlling distortion cancellation of an RF signal in a control loop of an amplifier system, said control loop having a first signal path and a second signal path, an input and an output, said first and second signal paths having a delay mismatch, said method comprising:
    injecting a pilot tone into said RF signal, said pilot tone having a single pilot frequency offset from the center frequency of the RF signal bandwidth;
    detecting the pilot signal at said output; and
    controlling the phase of at least one of said first and second signal paths of the control loop to stabilize control loop distortion cancellation at a frequency offset from the pilot signal frequency and generally symmetrical about the center of the RF signal bandwidth.

* * * * *

UNITED STATES PATENT AND TRADEMARK OFFICE
CERTIFICATE OF CORRECTION

PATENT NO.       : 7,002,407 B2
APPLICATION NO.  : 10/733498
DATED            : February 21, 2006
INVENTOR(S)      : Matthew J. Hunton et al.

It is certified that error appears in the above-identified patent and that said Letters Patent is hereby corrected as shown below:

The Assignee location should read as follows: "Santa Ana, California (US)"

Signed and Sealed this

Twenty-second Day of August, 2006

JON W. DUDAS
*Director of the United States Patent and Trademark Office*